(12) United States Patent
Bishop

(10) Patent No.: US 9,768,527 B2
(45) Date of Patent: Sep. 19, 2017

(54) SINGLE ELEMENT WIRE TO BOARD CONNECTOR

(71) Applicant: AVX Corporation, Fountain Inn, SC (US)

(72) Inventor: Peter Bishop, Cambs (GB)

(73) Assignee: AVX CORPORATION, Fountain Inn, SC (US)

( * ) Notice: Subject to any disclaimer, the term of this patent is extended or adjusted under 35 U.S.C. 154(b) by 0 days.

(21) Appl. No.: 15/288,538

(22) Filed: Oct. 7, 2016

(65) Prior Publication Data

US 2017/0025770 A1    Jan. 26, 2017

Related U.S. Application Data

(63) Continuation of application No. 14/844,160, filed on Sep. 3, 2015, now Pat. No. 9,466,893, which is a
(Continued)

(51) Int. Cl.
*H01R 4/24* (2006.01)
*H01R 4/48* (2006.01)
(Continued)

(52) U.S. Cl.
CPC ........... *H01R 4/2404* (2013.01); *H01R 4/183* (2013.01); *H01R 4/4836* (2013.01); *H01R 12/53* (2013.01); *H01R 12/70* (2013.01); *H01R 12/7076* (2013.01); *H01R 12/718* (2013.01); *H01R 13/62* (2013.01); *H05K 1/111* (2013.01);
(Continued)

(58) Field of Classification Search
CPC .... H01R 13/113; H01R 13/112; H01R 4/4818
See application file for complete search history.

(56) References Cited

U.S. PATENT DOCUMENTS 1,622,631 A    3/1927   Fahnestock
2,122,252 A    6/1938   Hayes
(Continued)

FOREIGN PATENT DOCUMENTS

DE    19735835 A1    2/1999
DE    19735835 B4    12/2004
(Continued)

OTHER PUBLICATIONS

Combined Search and Examination Report received for United Kingdom Patent Application No. GB1319036.8 mailed Apr. 17, 2014 (6 pages).
(Continued)

*Primary Examiner* — Ross Gushi
(74) *Attorney, Agent, or Firm* — Foley & Lardner LLP

(57) ABSTRACT

A single element electrical connector includes a single conductive contact element formed into a cage structure having a wire insert end and a wire contact end along a longitudinal centerline axis of the connector. The cage structure defines an upper pick-up surface having a surface area suitable for placement of a suction nozzle of a vacuum transfer device, as well as a pair of contact tines biased towards the centerline axis to define a contact pinch point for an exposed core of a wire inserted into the connector. A contact surface is defined by a member of the cage structure for electrical mating contact with a respective contact element on a component on which the connector is mounted.

20 Claims, 11 Drawing Sheets

Related U.S. Application Data continuation of application No. 14/312,505, filed on Jun. 23, 2014, now Pat. No. 9,136,641, which is a continuation of application No. 13/927,231, filed on Jun. 26, 2013, now abandoned, which is a continuation-in-part of application No. 13/666,427, filed on Nov. 1, 2012, now Pat. No. 8,721,376.

(51) Int. Cl.

| | | |
|---|---|---|
| H01R 12/53 | (2011.01) | |
| H01R 12/71 | (2011.01) | |
| H05K 3/32 | (2006.01) | |
| H01R 4/18 | (2006.01) | |
| H01R 12/70 | (2011.01) | |
| H01R 13/62 | (2006.01) | |
| H05K 1/11 | (2006.01) | |
| H01R 101/00 | (2006.01) | |
| H05K 3/34 | (2006.01) | |

(52) U.S. Cl.
CPC ......... *H05K 3/325* (2013.01); *H01R 2101/00* (2013.01); *H05K 3/3421* (2013.01); *H05K 2201/09072* (2013.01); *H05K 2201/10287* (2013.01); *H05K 2201/10333* (2013.01); *H05K 2201/10962* (2013.01)

(56) References Cited

U.S. PATENT DOCUMENTS

| | | |
|---|---|---|
| 2,603,681 A | 7/1952 | Salisbury |
| 2,689,337 A | 9/1954 | Burtt et al. |
| 3,076,953 A | 2/1963 | Sloop |
| 3,162,501 A | 12/1964 | Wahl |
| 3,221,293 A | 11/1965 | Regan |
| 3,363,224 A | 1/1968 | Gluntz et al. |
| 3,437,983 A | 4/1969 | Gilissen |
| 3,479,634 A | 11/1969 | Pritulsky |
| 3,510,831 A | 5/1970 | De Vito |
| 3,555,497 A | 1/1971 | Watanabe |
| 3,566,342 A | 2/1971 | Schmitt et al. |
| 3,601,775 A | 8/1971 | Longenecker et al. |
| 3,609,640 A | 9/1971 | Longenecker et al. |
| 3,621,444 A | 11/1971 | Stein |
| 3,654,583 A | 4/1972 | Mancini |
| 3,663,931 A | 5/1972 | Brown |
| 3,673,551 A | 6/1972 | McDonough |
| 3,678,261 A | 7/1972 | McNeil |
| 3,711,819 A | 1/1973 | Matthews |
| 3,718,895 A | 2/1973 | Reynolds et al. |
| 3,720,907 A | 3/1973 | Asick |
| 3,778,755 A | 12/1973 | Marks |
| 3,796,988 A | 3/1974 | Palombella |
| 3,805,116 A | 4/1974 | Nehmann |
| 3,818,423 A | 6/1974 | McDonough |
| 3,824,557 A | 7/1974 | Mallon |
| 3,846,735 A | 11/1974 | Carter et al. |
| 3,850,500 A | 11/1974 | Cobaugh et al. |
| 3,853,389 A | 12/1974 | Occhipinti |
| 3,867,008 A | 2/1975 | Gartland, Jr. |
| 3,907,392 A | 9/1975 | Haag et al. |
| 3,915,537 A | 10/1975 | Harris et al. |
| 3,915,544 A | 10/1975 | Yurtin |
| 3,937,553 A | 2/1976 | Maximoff et al. |
| 3,945,710 A | 3/1976 | Gartland, Jr. |
| 3,950,065 A | 4/1976 | Renn |
| 3,955,869 A | 5/1976 | Licht |
| 3,963,302 A | 6/1976 | Gourley |
| 3,963,316 A | 6/1976 | Williams |
| 3,989,331 A | 11/1976 | Hanlon |
| 3,992,076 A | 11/1976 | Gluntz |
| 4,012,107 A | 3/1977 | Cobaugh et al. |
| 4,076,369 A | 2/1978 | Ostapovitch |
| 4,083,623 A | 4/1978 | Lynch |
| 4,152,042 A | 5/1979 | Ostapovitch |
| 4,193,660 A | 3/1980 | Jaconette |
| 4,214,801 A | 7/1980 | Cairns et al. |
| 4,232,931 A | 11/1980 | Takeuchi et al. |
| 4,262,983 A | 4/1981 | Bogese, II |
| 4,299,436 A | 11/1981 | Ackerman |
| 4,317,609 A | 3/1982 | Lapraik |
| 4,331,376 A | 5/1982 | Leather |
| 4,359,258 A | 11/1982 | Palecek et al. |
| 4,379,611 A | 4/1983 | Foege et al. |
| 4,472,017 A | 9/1984 | Sian |
| 4,527,857 A | 7/1985 | Hughes et al. |
| 4,556,274 A | 12/1985 | Olivera |
| 4,585,295 A | 4/1986 | Ackerman |
| 4,605,277 A | 8/1986 | DeFilippis et al. |
| 4,618,205 A | 10/1986 | Freeman |
| 4,640,561 A | 2/1987 | George |
| 4,643,510 A | 2/1987 | Urani |
| 4,657,336 A | 4/1987 | Johnson et al. |
| 4,708,416 A | 11/1987 | Awano |
| 4,728,304 A | 3/1988 | Fischer |
| 4,740,180 A | 4/1988 | Harwath et al. |
| 4,767,342 A | 8/1988 | Sato |
| 4,772,234 A | 9/1988 | Cooper |
| 4,781,602 A | 11/1988 | Cobaugh |
| 4,784,622 A | 11/1988 | Senor |
| 4,813,881 A | 3/1989 | Kirby |
| 4,822,288 A | 4/1989 | Conley |
| 4,907,990 A | 3/1990 | Bertho et al. |
| 4,932,891 A | 6/1990 | Spanke et al. |
| 4,932,906 A | 6/1990 | Kaley et al. |
| 4,934,967 A | 6/1990 | Marks et al. |
| 4,952,178 A | 8/1990 | Beer |
| 4,968,271 A | 11/1990 | Buscella |
| 5,024,627 A | 6/1991 | Bennett et al. |
| 5,035,658 A | 7/1991 | Berg |
| 5,038,467 A | 8/1991 | Murphy |
| 5,046,972 A | 9/1991 | Pass |
| 5,049,095 A | 9/1991 | Gugelmeyer |
| 5,064,379 A | 11/1991 | Ryll et al. |
| 5,116,238 A | 5/1992 | Holloman |
| 5,131,853 A | 7/1992 | Meyer |
| 5,152,702 A | 10/1992 | Pilny |
| 5,167,544 A | 12/1992 | Brinkman et al. |
| 5,169,322 A | 12/1992 | Frantz et al. |
| 5,213,530 A | 5/1993 | Uratsuji |
| 5,263,883 A | 11/1993 | Kirayoglu |
| 5,269,712 A | 12/1993 | Denlinger et al. |
| 5,352,125 A | 10/1994 | Banakis et al. |
| 5,362,244 A | 11/1994 | Hanson et al. |
| 5,383,800 A | 1/1995 | Saka et al. |
| 5,397,254 A | 3/1995 | Powell |
| 5,399,108 A | 3/1995 | Lu et al. |
| 5,415,571 A | 5/1995 | Lutsch |
| 5,458,513 A | 10/1995 | Matsuoka |
| 5,529,517 A | 6/1996 | Hopf et al. |
| 5,551,897 A | 9/1996 | Alwine |
| 5,611,717 A | 3/1997 | Joly |
| 5,615,944 A | 4/1997 | Siegfried et al. |
| 5,618,187 A | 4/1997 | Goto |
| 5,645,458 A | 7/1997 | Hotea |
| 5,664,972 A | 9/1997 | Zinn et al. |
| 5,676,570 A | 10/1997 | Scherer |
| 5,713,767 A | 2/1998 | Hanson et al. |
| 5,769,672 A | 6/1998 | Flieger |
| 5,788,539 A | 8/1998 | Fedder |
| 5,888,096 A | 3/1999 | Soes et al. |
| 5,890,936 A | 4/1999 | McDonald et al. |
| 5,941,740 A | 8/1999 | Neuer et al. |
| 5,941,741 A | 8/1999 | Dobbelaere et al. |
| 5,975,963 A | 11/1999 | Higuchi et al. |
| 6,000,974 A | 12/1999 | Hotea |
| 6,012,944 A | 1/2000 | Hatakeyama |
| 6,039,584 A | 3/2000 | Ross |
| 6,039,597 A | 3/2000 | Getselis et al. |
| 6,050,845 A | 4/2000 | Smalley et al. |
| 6,051,781 A | 4/2000 | Bianca et al. |
| 6,056,585 A | 5/2000 | Hatakeyama et al. |
| 6,080,008 A | 6/2000 | Frantz |

(56) References Cited

U.S. PATENT DOCUMENTS

| | | |
|---|---|---|
| 6,089,880 A | 7/2000 | Miyagawa et al. |
| 6,128,181 A | 10/2000 | Higami et al. |
| 6,135,784 A | 10/2000 | Pei |
| 6,171,126 B1 | 1/2001 | Wu et al. |
| 6,186,840 B1 | 2/2001 | Geltsch et al. |
| 6,193,567 B1 | 2/2001 | Hsieh |
| 6,210,240 B1 | 4/2001 | Comerci et al. |
| 6,254,422 B1 | 7/2001 | Feye-Hohmann |
| 6,264,498 B1 | 7/2001 | Froberg |
| 6,283,769 B1 | 9/2001 | Asao et al. |
| 6,309,236 B1 | 10/2001 | Ullrich |
| 6,315,591 B2 | 11/2001 | Oda et al. |
| 6,319,076 B1 | 11/2001 | Gollhofer et al. |
| 6,371,772 B1 | 4/2002 | Yoneyama et al. |
| 6,379,179 B2 | 4/2002 | Shinohara |
| 6,383,039 B1 | 5/2002 | Yoneyama et al. |
| 6,394,829 B1 | 5/2002 | Patterson et al. |
| 6,394,858 B1 | 5/2002 | Geltsch et al. |
| 6,439,934 B1 | 8/2002 | Yu |
| 6,439,935 B2 | 8/2002 | Saka et al. |
| 6,442,036 B2 | 8/2002 | Komatsu |
| 6,475,042 B1 | 11/2002 | Yu |
| 6,478,635 B2 | 11/2002 | Charles et al. |
| 6,511,336 B1 | 1/2003 | Turek et al. |
| 6,551,143 B2 | 4/2003 | Tanaka et al. |
| 6,561,828 B2 | 5/2003 | Henrici et al. |
| 6,652,303 B2 | 11/2003 | Stockel et al. |
| 6,776,635 B2 | 8/2004 | Blanchfield et al. |
| 6,805,591 B2 | 10/2004 | Garland et al. |
| 6,814,598 B2 | 11/2004 | Hoffmann et al. |
| 6,827,613 B2 | 12/2004 | Ferderer |
| 6,991,498 B2 | 1/2006 | Wertz et al. |
| 7,048,597 B2 | 5/2006 | Chen |
| 7,175,469 B1 | 2/2007 | Daily et al. |
| 7,217,162 B2 | 5/2007 | Harada et al. |
| 7,303,421 B2 | 12/2007 | Liao |
| 7,320,616 B1 | 1/2008 | Legrady et al. |
| 7,357,651 B2 | 4/2008 | Minoura et al. |
| 7,503,814 B1 | 3/2009 | Lin |
| 7,530,837 B2 | 5/2009 | Nieleck et al. |
| 7,556,509 B1 | 7/2009 | Oh et al. |
| 7,581,965 B1 | 9/2009 | Upasani et al. |
| 7,654,874 B2 | 2/2010 | Ader |
| 7,704,103 B1 | 4/2010 | Rhein et al. |
| 7,731,550 B2 | 6/2010 | Falchetti |
| 7,771,217 B2 | 8/2010 | Bethurum et al. |
| 7,771,243 B2 | 8/2010 | Peterson et al. |
| 7,780,489 B2 | 8/2010 | Stuklek |
| 7,806,738 B2 | 10/2010 | Wu et al. |
| 7,892,050 B2 | 2/2011 | Pavlovic et al. |
| 7,967,648 B2 | 6/2011 | Byrne |
| 7,988,506 B2 | 8/2011 | Peterson et al. |
| 7,997,915 B2 | 8/2011 | Pueschner et al. |
| 8,062,046 B2 | 11/2011 | Daily et al. |
| 8,096,814 B2 | 1/2012 | Schell et al. |
| 8,113,859 B2 | 2/2012 | Kim |
| 8,182,229 B2 | 5/2012 | Rajarajan et al. |
| 8,182,299 B2 | 5/2012 | Schrader |
| 8,206,182 B2 | 6/2012 | Kuo et al. |
| 8,206,184 B2 | 6/2012 | Kwasny et al. |
| 8,221,167 B2 | 7/2012 | Kuo et al. |
| D668,621 S | 10/2012 | Gieski |
| 8,277,240 B2 | 10/2012 | Urano |
| 8,328,586 B2 | 12/2012 | Bies et al. |
| 8,339,235 B2 | 12/2012 | Beckert et al. |
| 8,446,733 B2 | 5/2013 | Hampo et al. |
| 8,512,050 B2 | 8/2013 | McGreevy et al. |
| RE44,490 E | 9/2013 | Kirstein et al. |
| 8,591,271 B2 | 11/2013 | Bies |
| 8,721,376 B1 | 5/2014 | Bishop |
| 2002/0009908 A1 | 1/2002 | Liu et al. |
| 2002/0187670 A1 | 12/2002 | Cisey |
| 2004/0038597 A1 | 2/2004 | Norris |
| 2004/0077231 A1 | 4/2004 | Harada et al. |
| 2005/0054244 A1 | 3/2005 | Werner et al. |
| 2005/0287878 A1 | 12/2005 | Urbaniak et al. |
| 2006/0292937 A1 | 12/2006 | Morello et al. |
| 2007/0149015 A1 | 6/2007 | Minoura et al. |
| 2008/0076277 A1 | 3/2008 | Chen et al. |
| 2008/0124956 A1 | 5/2008 | Wu |
| 2008/0214027 A1 | 9/2008 | Schell et al. |
| 2009/0209143 A1 | 8/2009 | Wu et al. |
| 2010/0173540 A1 | 7/2010 | Lee et al. |
| 2011/0039458 A1 | 2/2011 | Byrne |
| 2011/0076901 A1 | 3/2011 | Glick et al. |
| 2011/0250803 A1 | 10/2011 | Bies |
| 2012/0083141 A1 | 4/2012 | Molnar et al. |
| 2012/0108113 A1 | 5/2012 | Yamaguchi et al. |
| 2012/0295494 A1 | 11/2012 | Chen |
| 2013/0168146 A1 | 7/2013 | Kim et al. |
| 2013/0210247 A1 | 8/2013 | Wang et al. |
| 2013/0316563 A1 | 11/2013 | Brandberg et al. |
| 2014/0120783 A1 | 5/2014 | Bishop |
| 2014/0242833 A1 | 8/2014 | Mostoller et al. |

FOREIGN PATENT DOCUMENTS

| | | |
|---|---|---|
| DE | 10 2010 014 143 A1 | 10/2011 |
| DE | 10 2010 014 144 A1 | 10/2011 |
| DE | 20 2011 104 301 U1 | 11/2011 |
| DE | 10 2011 015 968 A1 | 10/2012 |
| DE | 10 2011 079 318 A1 | 1/2013 |
| DE | 20 2010 018 177 U1 | 7/2014 |
| EP | 0 829 924 A2 | 3/1998 |
| EP | 2 597 729 A1 | 5/2013 |
| GB | 2 298 530 | 9/1996 |
| GB | 2 510 020 | 7/2014 |
| WO | WO-2011/083031 | 7/2011 |

OTHER PUBLICATIONS

Combined Search and Examination Report received in United Kingdom Application No. GB1410966.4 issued Nov. 18, 2014, 6 pages.

Final Office Action issued in U.S. Appl. No. 13/666,427 mailed Dec. 6, 2013 (9 pages).

Final Office Action received in U.S. Appl. No. 13/927,231 mailed Dec. 6, 2013 (5 pages).

Non-Final Office Action received in U.S. Appl. No. 13/666,427 mailed Sep. 13, 2013 (12 pages).

Non-Final Office Action received in U.S. Appl. No. 13/927,231 mailed Sep. 13, 2013 (19 pages).

Non-Final Office Action received in U.S. Appl. No. 14/267,699 mailed Apr. 17, 2015, 18 pages.

Notice of Allowance received for U.S. Appl. No. 14/267,699 mailed Jul. 10, 2015, 5 pages.

Notice of Allowance received for U.S. Appl. No. 14/312,505 mailed May 15, 2015, 13 pages.

Notice of Allowance received in U.S. Appl. No. 13/666,427 mailed Feb. 19, 2014 (22 pages).

Office Action received in Chinese Application No. 201310533504.5 issued Jul. 3, 2015, English translation (9 pages).

Office Action received in Chinese Application No. 201410289785.9, dated Dec. 31, 2015, with English translation (23 pages).

Office Action received in German Application No. 102014108965.0 issued Jun. 8, 2015.

Official Notice of Rejection received in Japanese Patent Application No. 2014-129243 mailed May 19, 2015 (English translation).

US Office Action on U.S. Appl. No. 14/844,160 DTD May 13, 2016.

U.S. Office Action on 104298-0394 dated Aug. 17, 2015.

SINGLE ELEMENT WIRE TO BOARD CONNECTOR

CROSS-REFERENCE TO RELATED PATENT APPLICATIONS

The present application is a continuation of U.S. patent application Ser. No. 14/844,160 (now U.S. Pat. No. 9,466,893), filed Sep. 3, 2015, which is a continuation of U.S. patent application Ser. No. 14/312,505 (now U.S. Pat. No. 9,136,641), filed Jun. 23, 2014, which is a continuation of U.S. patent application Ser. No. 13/927,231, filed Jun. 26, 2013, which is a continuation-in-part of U.S. patent application Ser. No. 13/666,427 (now U.S. Pat. No. 8,721,376), filed Nov. 1, 2012, each of which is incorporated herein by reference in its respective entirety.

FIELD

The present application relates generally to the field of electrical connectors, and more particularly to a type of connector used to connect an insulated wire to a component, such as a printed circuit board (PCB).

BACKGROUND

Various types of connectors are used for forming connections between an insulated wire and any manner of electronic component. These connectors are typically available as sockets, plugs, and shrouded headers in a vast range of sizes, pitches, and plating options. Many of these conventional connectors are referred to as Insulation Displacement Connectors (IDC) in that they include one or more contact elements incorporating a set of blades or jaws that cut through the insulation around the wire and make electrical contact with the conductive core in a one-step process, thus eliminating the need for wire stripping and crimping, or other wire preparation. IDC's are used extensively in the telecommunications industry, and are becoming more widely used in printed circuit board (PCB) applications.

Various attempts have been made to configure IDC's for surface mounting technology (SMT) applications as well. For example, U.S. Pat. No. 7,320,616 describes an IDC specifically configured for SMT mounting to a PCB utilizing an insulation piercing configuration.

AVX Corporation of South Carolina, USA, offers a line of low profile IDC wire to board connectors (Series 9175-9177) that are SMT (surface mount technology) mounted to a circuit board prior to insertion of wires into contact slots with the aid of a hand tool. This process cuts the wire insulation and enables the conductive wire cores to form a secure conductive joint with the connector.

IDC wire to board connectors are, however, not suited for all applications wherein it is desired to connect one or more wires to a component. For example, the IDC's in the above cited references are relatively complicated in that they require multiple parts that are movable relative to each other. A main insulative body is a separate component from the contact element and all or a portion of the main body must be movable or slidable relative to the contacts to make final connection with the wires after ends of the contacts have been inserted into through holes in the PCB or surface mounted to the PCB. The main insulative body of conventional IDC's can also take up valuable space (real estate) on the PCB. In this regard, IDS's are relatively complex, large, and can be cost prohibitive in certain applications.

In an embodiment, the present application provides an alternative to IDC wire to board connectors that is rugged, reliable, and simple in design.

SUMMARY

In accordance with an embodiment, an electrical connector is provided that is particularly well suited for connecting at least one insulated conductive core wire to an electrical component, such as a PCB. It should be appreciated that connectors according to the embodiment are not limited to use with boards, but may be used in any application wherein a secure electrical connection is desired between wires and any other type of component. The connectors will be described herein as used to connect wires to PCB's for illustrative purposes only.

In accordance with an embodiment, the connector is a "single element" connector in that it is formed from a single conductive contact member and does not include an insulative body or molding. The connector may be suited for a pick-and-place mounting process wherein a vacuum transfer device places the connector for subsequent surface mounting to a PCB, as is understood by those skilled in the art. The connectors are not, however, limited to this mounting technique.

An embodiment of a single element electrical connector includes a single conductive contact element formed into a cage structure, with this cage structure defining a wire insert end and a wire contact end arranged along a longitudinal centerline axis of the connector. The cage structure includes a wall structure at the insert end that defines an inlet opening for a wire at the insert end. For example, in one embodiment, the wall structure may include a plurality of walls formed into a box-like structure at the insert end, with one of the walls defining an upper pick-up surface having a surface area suitable for placement of a suction nozzle of a vacuum transfer device. The cage structure further includes a pair of contact tines biased towards the centerline axis of the connector downstream of the wall structure at the insert end in an insertion direction of the wire into the connector, with the contact tines defining a contact pinch point for an exposed core of the wire. A component of the cage structure defines a contact surface for electrical mating contact with a respective contact element or pad on the component to which the connector is mounted, such as a PCB.

In an embodiment, the connector is formed from a single stamped metal sheet bent or otherwise formed into the cage structure. Any number and configuration of cuts, reliefs, and the like, may be formed in the metal sheet to facilitate bending or otherwise shaping the metal sheet into the cage structure having the features described herein.

As mentioned, in an embodiment, the cage structure includes a plurality of walls bent into a box-like structure having a top wall, bottom wall, and side walls at the insert end of the connector, with the top wall defining the pick-up surface. In this embodiment, the top wall may be a bent-over extension of one of the side walls that extends to the opposite side wall.

The top and bottom walls may be generally parallel in one embodiment, with one or both of the top and bottom walls including a forward portion that is angled towards the centerline axis of the connector to define an upper wire guide (top wall) and/or lower wire guide (bottom wall).

The contact tines may be variously configured by the cage structure. In an embodiment, the contact tines are forward portions of the side walls that are angled towards the centerline axis at the wire contact end of the connector. The tines may include release tabs extending from a forward-most portion of the contact tines, with the release tabs configured for engagement by a tool to separate the contact tines in order to remove a wire inserted into the connector. The release tabs may extend generally parallel to the centerline axis.

In another embodiment, the cage structure may include an end wire stop wall defined forward of the contact tines in an insertion direction of a wire into the connector, with this wall defining the ultimate end position of the conductive core of the wire in the connector. The stop wall may be variously configured by the cage structure. For example, in one embodiment, the bottom wall may extend below the contact tines, with the stop wall defined by a forward portion of the bottom wall that is bent upwards towards the centerline axis.

As mentioned, the connector is not limited by its mounting technique to a PCB or other component. In one embodiment, the contact surface is defined by a portion of the bottom wall of the cage structure such that the connector is surface mountable to a contact pad on a PCB with the centerline axis generally parallel to the PCB. In another embodiment, the connector may be intended for a through-board or top mount configuration wherein the connector extends generally perpendicular to the PCB. In this configuration, the contact surface may be defined by contact feet extending generally transversely from the walls (bottom, top, or side walls).

The present application also encompasses any manner of electrical component assembly that incorporates the unique connector element introduced above and described in detail below to electrically connect one or more wires to an electrical component. For example, the component assembly may include a PCB in electrical mating contact with one or more conductive wires via the electrical connector.

Particular embodiments of the unique insulation displacement connectors are described in greater detail below by reference to the examples illustrated in the drawings.

DETAILED DESCRIPTION

Figure 1:
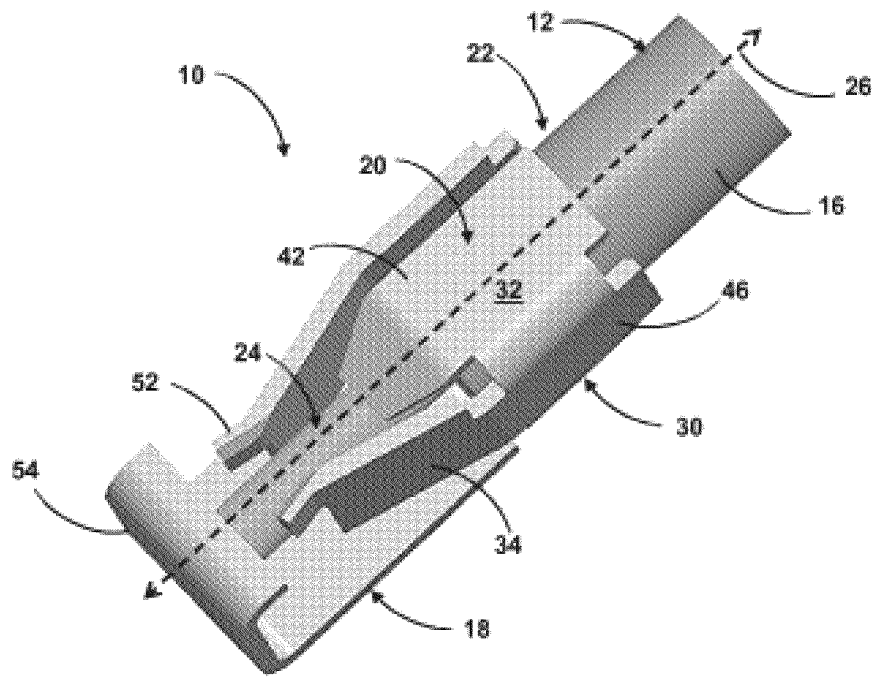
FIG. 1 depicts a perspective view of a connector in accordance with an illustrative embodiment.

Reference will now be made to various embodiments, one or more examples of which are illustrated in the figures. The embodiments are provided by way of explanation of the invention, and are not meant as a limitation of the invention. For example, features illustrated or described as part of one embodiment may be used with another embodiment to yield still a further embodiment. It is intended that the present application encompass these and other modifications and variations as come within the scope and spirit of the invention.

Exemplary embodiments of an electrical connector 10 according to various embodiments are illustrated in FIGS. 1 through 8. The electrical connector 10 is configured for connecting the conductive core of an insulated wire to any manner of electrical component, such as a printed circuit board (PCB). For ease of explanation and illustration, the electrical connector 10 is illustrated and referred to herein in the context of connecting wires to a PCB. In addition, the electrical connector 10 is depicted in the figures as a "single-way" connector in that it includes only a single wire position. It should be appreciated that the electrical connector 10 is not limited by the number of wire positions, and multi-way embodiments are contemplated within the scope and spirit of the invention. For example, in alternative embodiments, the cage structure may be formed into a two-way or a three-way connector in addition to the illustrated single-way connector.

Referring to the figures in general, the electrical connector 10 is depicted as a single element electrical connector in accordance with various illustrative embodiments. The electrical connector 10 is particularly suited for connecting a wire 12 to any manner of electrical component, such as a PCB. The wire 12 may be a stranded or solid core wire having a core 14 surrounded by an insulation material 16. Prior to insertion of the wire 12 into the electrical connector 10, a section of the insulation material 16 is stripped away from the core 14 adjacent to the end of the wire 12, as depicted in FIGS. 1 and 2.

As mentioned above, the electrical connector 10 is a "single element" connector in that it is formed from a single conductive element 18. The single conductive element 18 may be any suitable conductive metal material having a gauge and other physical characteristics suitable for maintaining the shape of the electrical connector 10 in the mounting process, as well as in the operating environment of the electrical component to which the electrical connector 10 is mounted.

Figure 2:
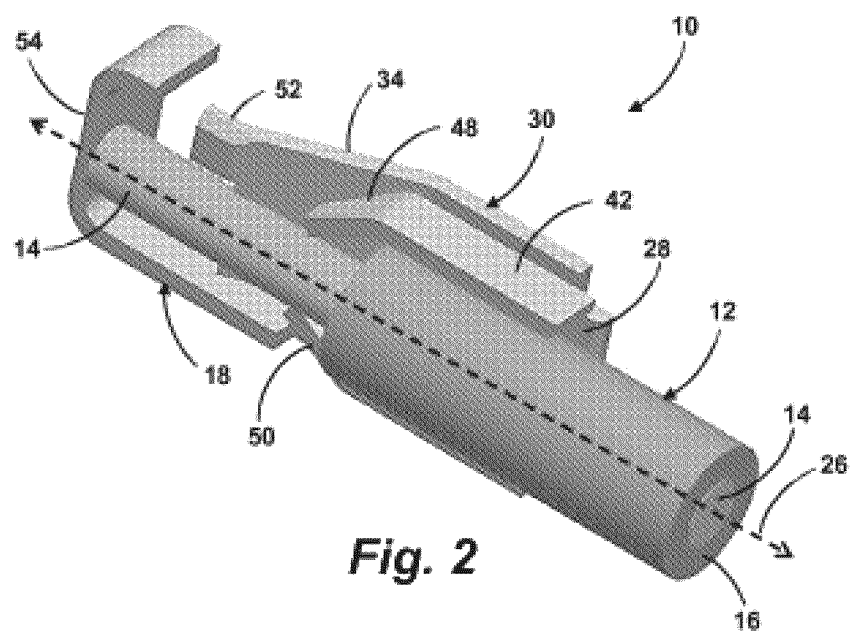
FIG. 2 depicts a side cut-away view showing the connector of FIG. 1 in accordance with an illustrative embodiment.

The single conductive element 18 is formed into a cage-like structure 20 as depicted in FIG. 1. In an embodiment, the single conductive element 18 is formed by bending a single piece of conductive material into the cage-like structure 20. The cage-like structure 20 includes a wire insert end 22 that defines an inlet opening 28 for insertion of the wire 12 into the electrical connector 10. The cage-like structure 20 also defines a wire contact end 24 (FIG. 1), which is the end of the cage-like structure 20 at which the exposed conductive core 14 of the wire 12 is contacted by the single conductive element 18. The wire insert end 22 and wire contact end 24 are aligned along a central longitudinal axis 26 of the electrical connector 10, as depicted in FIGS. 1 and 2.

In an embodiment, the cage-like structure 20 includes a wall structure 30 that essentially surrounds the wire 12. The wall structure 30 may include any number and configuration of walls, such as a circular wall, semicircular wall components, and so forth. At least a portion of the wall structure 30 defines a pick-up surface 32. The pick-up surface 32 has a surface area that is suitable for placement of a suction nozzle of a vacuum transfer device so that the electrical connector 10 may be transferred to an electrical component, such as a PCB, in a conventional pick-and-place process, as is understood by those skilled in the art. In a desirable embodiment, the electrical connector 10 is supplied in tape form that is fed to a conventional vacuum transfer device in the pick-and-place process.

The cage-like structure 20 includes a pair of contact tines 34 that are biased towards the central longitudinal axis 26 of the electrical connector 10 downstream of the wall structure 30 in the insertion direction of the wire 12 into the electrical connector 10. These contact tines 34 are defined by sections or cutouts of the single conductive element 18 and define a contact pinch point 36 (FIG. 3) for contact against the exposed core 14 of the wire 12. The contact pinch point 36 also serves as a clamp point to prevent inadvertent removal of the wire 12 from the electrical connector 10.

The electrical connector 10 includes a contact surface 38 that may be defined by any member or section of the cage-like structure 20. The contact surface 38 is provided for electrical mating contact with a respective contact element on the electronic component. For example, the contact surface 38 may be defined by any section of the bottom portion or wall of the cage-like structure 30 that mates with a corresponding contact pad on the PCB, wherein the electrical connector 10 may be surface mounted directly onto the contact pad of the PCB.

In an embodiment, the electrical connector 10 and the single conductive element 18 are formed from a single electrically-conductive sheet material that is bent or otherwise formed into the cage-like structure 20. Any manner of cuts, reliefs, or other structures may be cut or stamped into the single conductive element 18 to facilitate forming the single conductive element 18 into the overall configuration of the electrical connector 10 as described herein.

In an embodiment, the wall structure 30 includes a plurality of walls that are bent into a box-like structure 40 having a top wall 42, bottom wall 44, and opposite side walls 46. The top wall 42 defines the pick-up surface 32 discussed above. It should also be appreciated that any one of the other walls may also define the pick-up surface 32. The box-like structure 40 may be defined by the walls in various ways. For example, in an embodiment, the side walls 46 are components that are bent upwardly relative to the bottom wall 44, while the top wall 42 is defined by an extension of one of the side walls 46 that is bent towards the opposite side wall 46.

Figure 3:
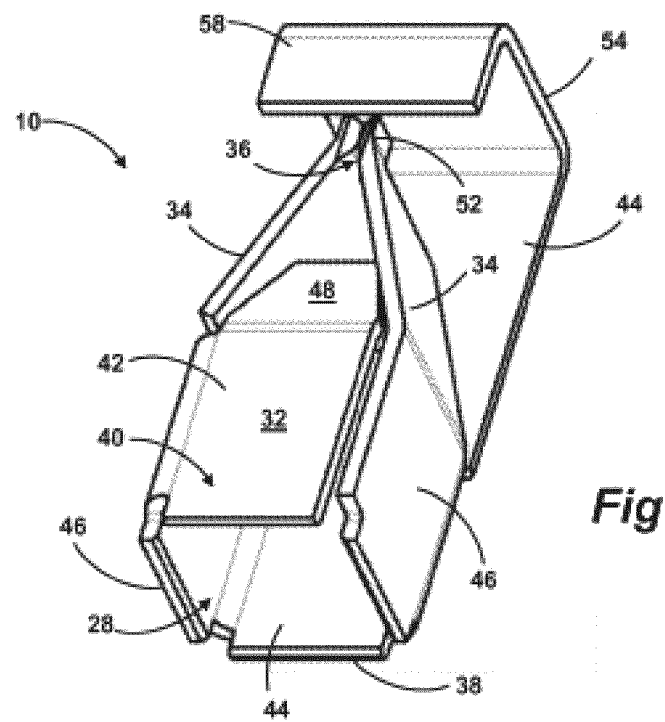
FIG. 3 depicts a perspective top and insert end view of a connector in accordance with an illustrative embodiment.
Figure 4:
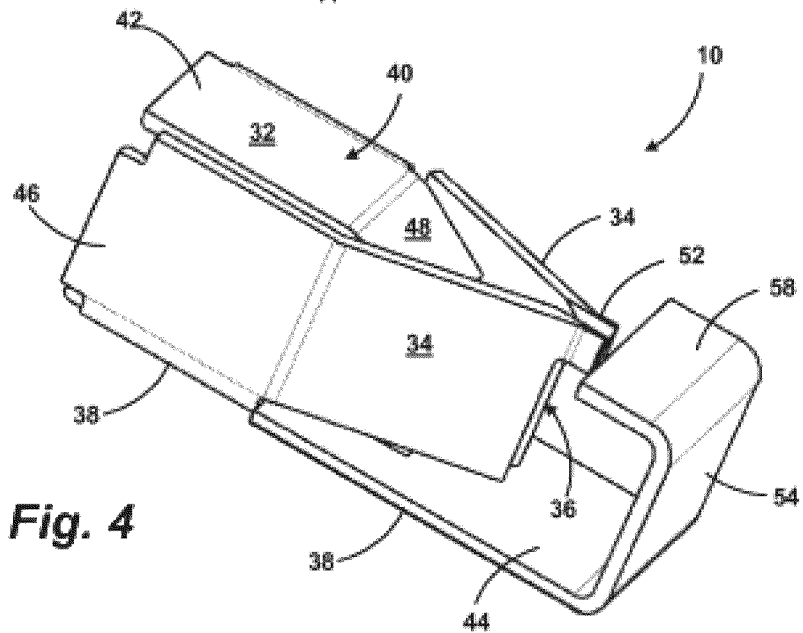
FIG. 4 depicts a perspective side view of the connector of FIG. 3 in accordance with an illustrative embodiment.
Figure 6:
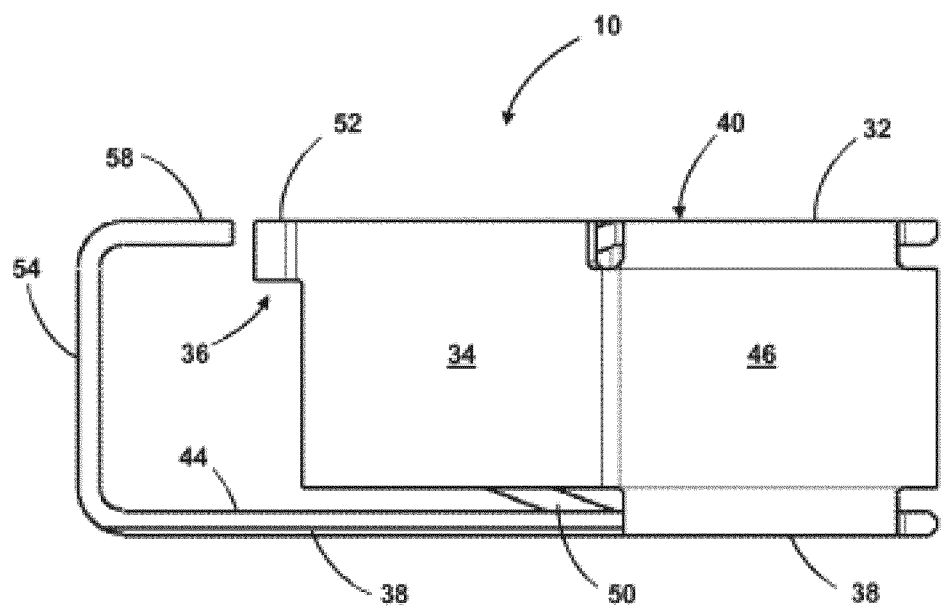
FIG. 6 depicts a side view of the connector of FIG. 3 in accordance with an illustrative embodiment.
Figure 7:
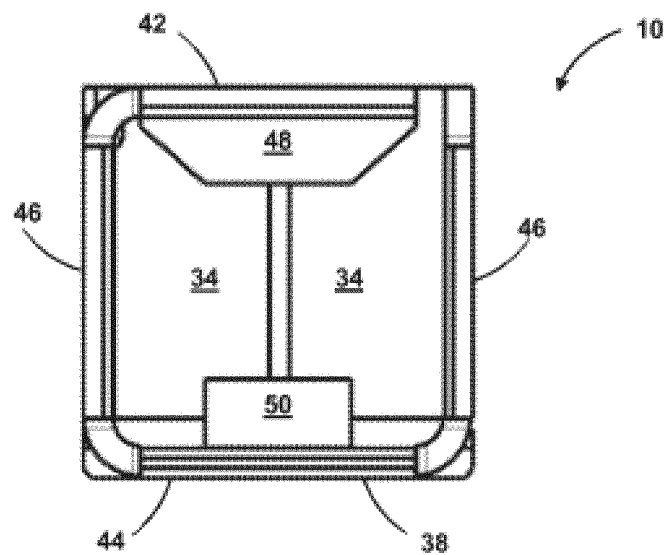
FIG. 7 depicts an end view of the connector of FIG. 3 in accordance with an illustrative embodiment.

Certain embodiments of the electrical connector 10 may also include guide surfaces within the cage-like structure 20 that serve to physically contact and align the wire 12 within the cage-like structure 20. In an embodiment, for example, an upper wire guide 48 is defined by an angled portion of the top wall 42. This upper wire guide 48 is angled from the generally parallel top wall (parallel to the bottom wall 44) towards the center longitudinal (or centerline) axis 26, as illustrated in FIGS. 2 and 3. Similarly, the bottom wall 44, which may be parallel to the top wall 42, may have a forward portion that is angled towards the center longitudinal axis 26 to define a lower wire guide 50, as illustrated in FIGS. 2, 6, and 7.

As mentioned, the contact tines 34 may be variously configured within the cage-like structure 20. In the illustrated embodiment, the contact tines 34 are defined by forward portions of each of the side walls 46 that are bent or angled towards the center longitudinal axis 26 to the pinch point 36. In this manner, the contact tines 34 are biased towards each other (and the center longitudinal axis 26). The contact tines 34 separate and engage against the core 14 of the wire as the wire inserted through the contact tines 34.

Figure 5:
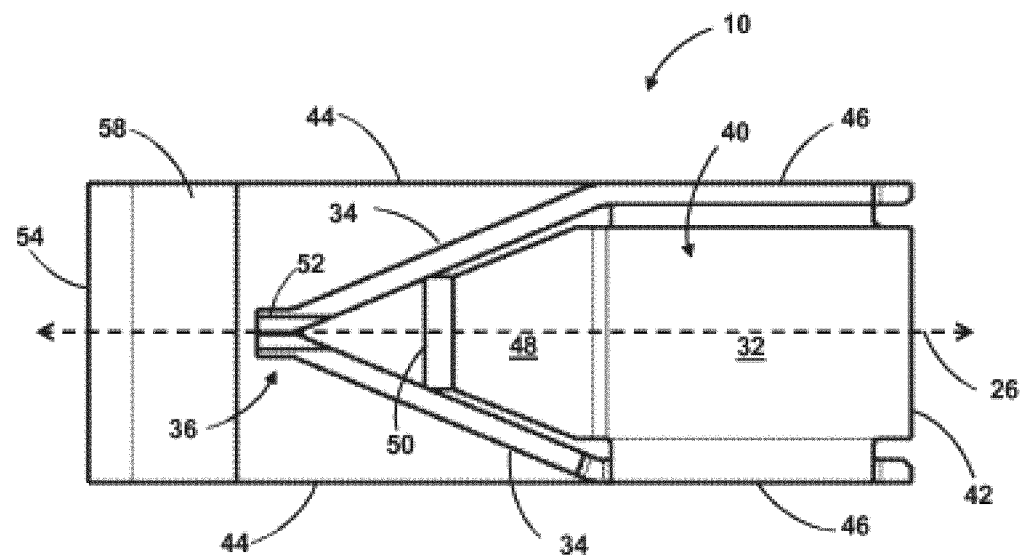
FIG. 5 depicts a top view of the connector of FIG. 3 in accordance with an illustrative embodiment.

In various embodiments, e.g., FIGS. 3 and 5, it may be desired to include one or more release tabs 52 defined on each of the contact tines 34 generally forward of the pinch point 36. The release tabs 52 provide a location for insertion of a tool between the contact tines 34 in order to open the contact tines 34 for removal of the wire 12 if desired. The release tabs 52 may be variously configured. In the illustrated embodiment, the release tabs 52 include generally forwardly extending tabs that are substantially parallel to the center longitudinal axis 26 with the wire 12 removed from the electrical connector 10, as depicted in FIG. 5.

In various embodiments, it may also be desired to include a wire stop wall 54 relative to the wire contact end 24 of the cage-like structure 20. The wire stop wall 54 provides a surface against which the conductive core 14 of the wire 12 may abut in the completely inserted position of the wire 12, as depicted in FIG. 2. The wire stop wall 54 may be variously configured. In an embodiment, the wire stop wall 54 is formed from a bent-up portion of the bottom wall 44. The wire stop wall 54 may further include an overhang or lip 58 that extends back towards the pinch point 36 of the contact tines 34. This overhang or lip 58 may serve to prevent inadvertent removal of the wire 12 in a vertical direction relative to the electrical connector 10.

As mentioned, the contact surface 38 may be defined by any portion of the bottom wall 44 (or any other wall) that aligns with a mating contact pad on a PCB. According to such an embodiment, the electrical connector 10 may be configured for conventional surface mount processes.

Figure 8:
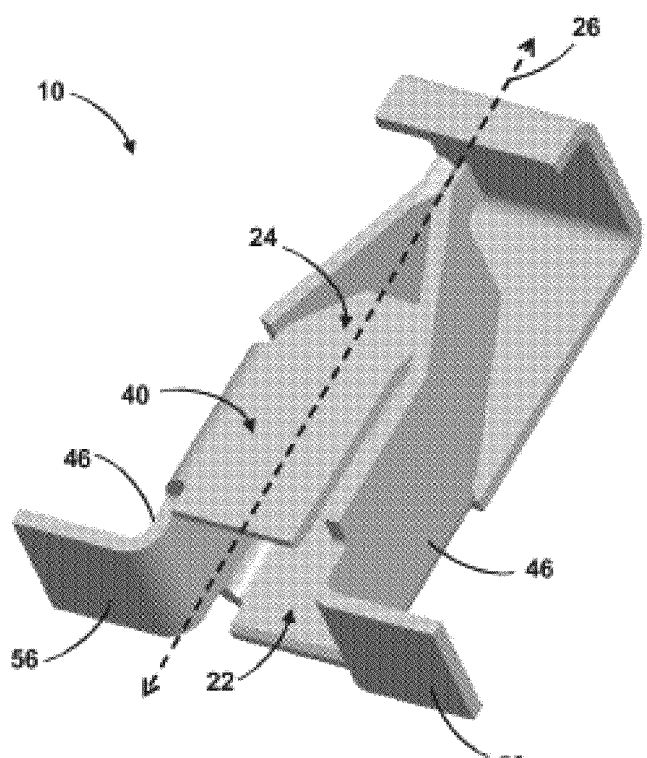
FIG. 8 depicts a perspective view of an alternative connector in accordance with an illustrative embodiment.

In an alternative embodiment depicted in FIG. 8, the electrical connector 10 may be configured for a thru-board connection wherein the connector extends through a hole in a PCB. Contact feet 56 are provided for mating against a contact pad on either side of the thru-hole in the PCB. Similarly, the contact feet 56 may serve for surface mounting of the electrical connector 10 on a PCB wherein the electrical connector 10 assumes a relatively vertical (i.e., perpendicular) orientation relative to the PCB. In the embodiment depicted in FIG. 8, the contact feet 56 are defined by outwardly bent portions of each side wall 46. In an alternative embodiment, the contact feet 56 may also be defined by outwardly bent portions of the bottom wall 44 and top wall 42.

Figure 9:
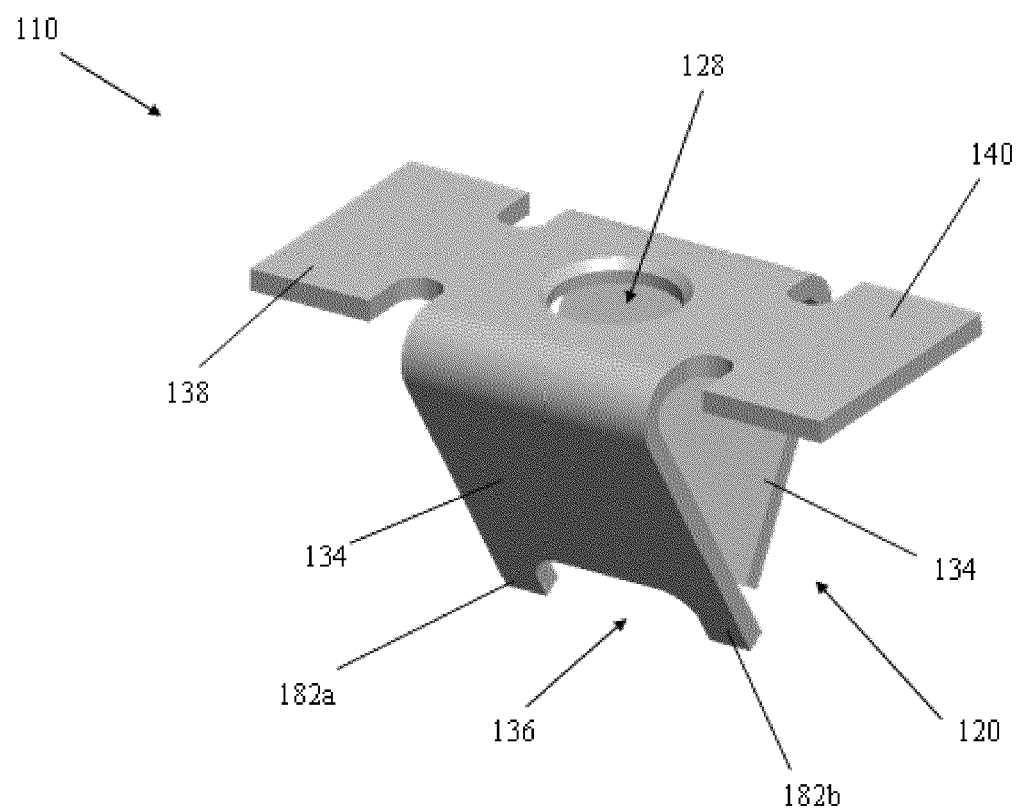
FIG. 9 depicts an electrical connector in accordance with an illustrative embodiment.

FIG. 9 depicts an electrical connector 110 in accordance with an illustrative embodiment. In an embodiment, the electrical connector 110 is a "single element" connector in that it is formed from a single conductive element. The single conductive element may be any suitable conductive metal material having a gauge and other physical characteristics suitable for maintaining the shape of the electrical connector 110 in the mounting process, as well as in the operating environment of the electrical component to which the electrical connector 110 is mounted. In an embodiment, the electrical connector 110 does not have an insulating component.

The electrical connector 110 includes an opening 128 that is configured to receive a wire or other electrically-conductive component inserted into the electrical connector 110. The electrical connector 110 includes a pair of contact tines 134. The pair of contact tines 134 are biased toward a central longitudinal axis of the electrical connector 110 downstream of the opening 128 in an insertion direction of a wire or other electrically-conductive component into the electrical connector 110. The contact tines 134 may be formed from portions of the single conductive element that are bent or angled toward the central longitudinal axis to form a pinch point 136. The contact tines 134 are configured to contact an exposed core or portion of a wire or other electrically-conductive component inserted into the electrical connector 110. The contact tines 134 may be configured to separate and engage against the core of the wire or other electrically-conductive component as the wire or other electrically-conductive component is inserted between the contact tines 134. In this way, the contact pinch point 136 may also perform a clamping mechanism to prevent inadvertent removal of the wire or other electrically-conductive component from the electrical connector 110. In various embodiments, it may be desirable to include one or more release tabs defined on each of the contact tines 134 to provide a location for insertion of a tool between the contact tines 134 in order to open the contact tines 134 for selective removal of the wire or other electrically-conductive component.

In various alternative embodiments, electrical connector 110 may include one or more additional contact tines 134. The contact tines 134 may be formed from sections or cutouts of the single conductive element.

In addition, one or more of contact tines 134 may include one or more release tabs 182a, 182b. In an embodiment, release tabs 182a, 182b are defined on one or more of the contact tines 134 generally forward of the pinch point 136. For example, the release tabs 182a, 182b may include extensions of a main body of the contact tines 134. The release tabs 182a, 182b provide a location for insertion of a tool between the contact tines 134 in order to open the contact tines 134 for removal of a wire if desired. The release tabs 182a, 182b may be variously configured. In the illustrated embodiment, the release tabs 182a, 182b include generally forwardly extending tabs that are substantially parallel to a center longitudinal axis that extends through the opening 128.

The electrical connector 110 also includes contact surfaces 138 and 140 that may be defined by any member or section of the single conductive material. The contact surfaces 138 and 140 are configured to electrically couple to respective contact elements on an electrical component such as a PCB or other electrical device. In an embodiment, the electrical connector 110 may be surface mounted directly onto the contact pad of the PCB or other electrical device.

Figure 10A:
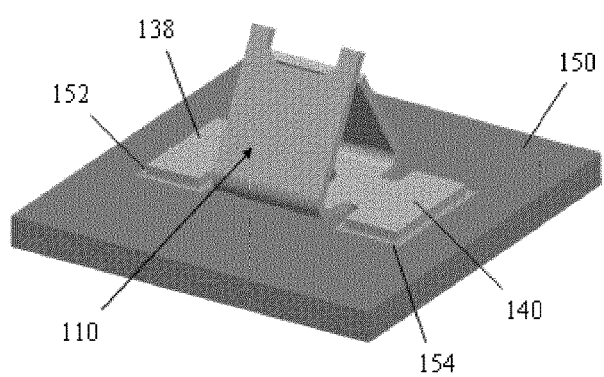
FIGS. 10a-10c depict a rear mounting configuration for an electrical connector in accordance with an illustrative embodiment.

FIG. 10a depicts a bottom view of a rear mounting configuration for the electrical connector 110 in accordance with an illustrative embodiment. In an embodiment, the electrical connector 110 is mounted to a surface of a PCB 150. The electrical connector 110 includes the contact surfaces 138 and 140 which are electrically coupled to contacts pads 152 and 154, respectively, of the PCB 150.

Figure 10C:
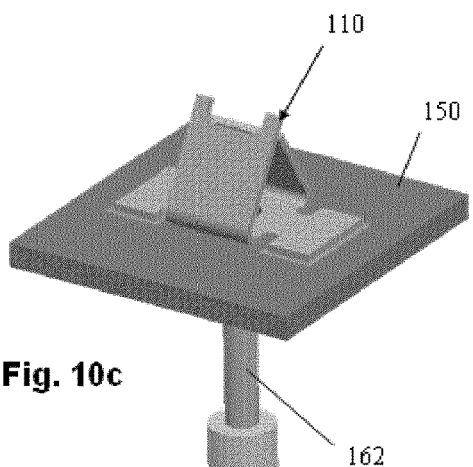
Figure 10B:
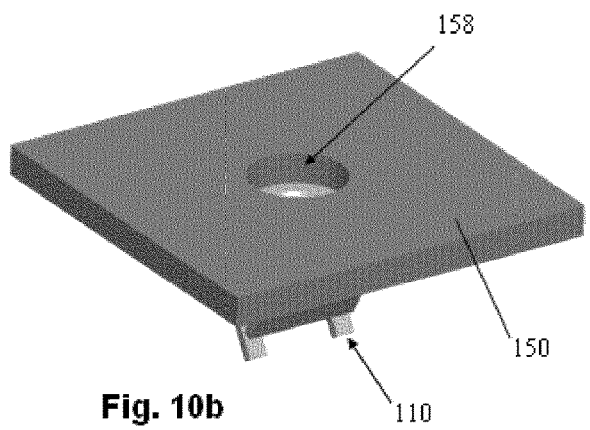

FIG. 10b depicts a top view of the rear mounting configuration for the electrical connector 110 in accordance with an illustrative embodiment. As mentioned above, the electrical connector 110 is mounted to a surface of the PCB 150. The PCB 150 includes an opening 158 that is configured to receive a wire or other electrically-conductive component to be inserted into the electrical connector 110.

FIG. 10c depicts another bottom view of the rear mounting configuration for the electrical connector 110 in accordance with an illustrative embodiment. A wire 160 includes an exposed conductive core 162. As discussed above, the PCB 150 includes the opening 158 which is configured to receive the exposed conductive core 162. The exposed conductive core 162 of the wire 160 may thus be inserted through the opening 158 of the PCB 150 into the electrical connector 110 such that the exposed conductive core 162 may be seated between the contact tines 134 of the electrical connector 110, thereby forming an electrical connection between the wire 160, the electrical connector 110, and the contact pads 152 and 154.

Figure 11A:
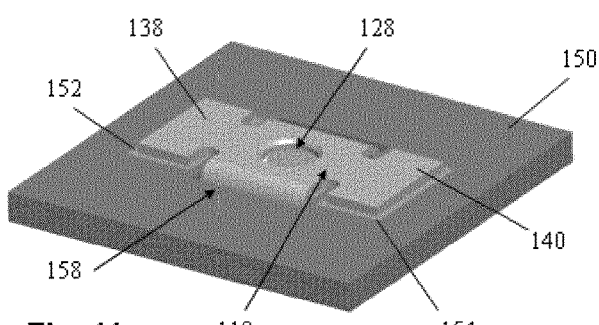
FIGS. 11a-11c depict a thru-board mounting configuration for an electrical connector in accordance with an illustrative embodiment.

FIG. 11a depicts a top view of a thru-board mounting configuration for the electrical connector 110 in accordance with an illustrative embodiment. In an embodiment, the electrical connector 110 is secured to a first surface of the PCB 150 and extends through the opening 158 in the PCB 150. The electrical connector 110 includes the contact surfaces 138 and 140 which are electrically coupled to contacts pads 152 and 154, respectively, on the first surface of the PCB 150. The contact tines 134 of the electrical connector 110 extend thru the opening 158 in the PCB 150 such that the contact tines 134 extend outward a distance from a second surface of the PCB 150 that is opposite the first surface.

Figure 11B:
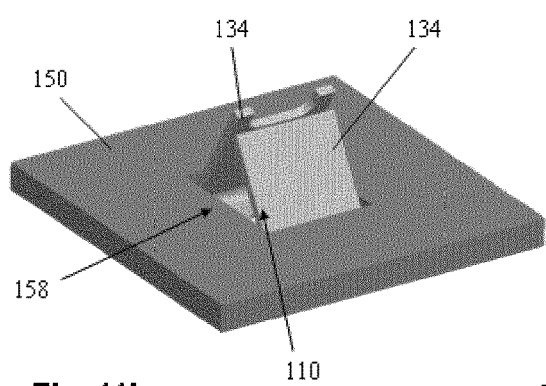

FIG. 11b depicts a bottom view of the thru-board mounting configuration for the electrical connector 110 in accordance with an illustrative embodiment. As mentioned above, the electrical connector 110 is mounted to a first surface of the PCB 150. The PCB 150 includes the opening 158 through which the contact tines 134 extend.

Figure 11C:
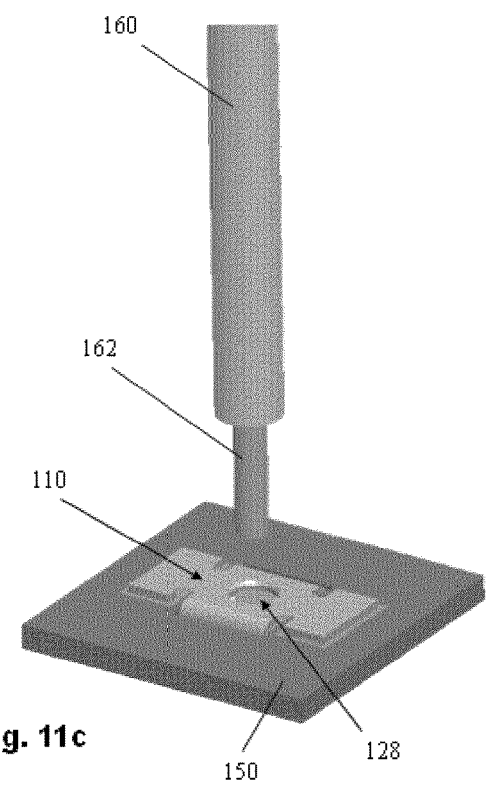

FIG. 11c depicts another top view of the thru-board mounting configuration for the electrical connector 110 in accordance with an illustrative embodiment. The wire 160 includes the exposed conductive core 162. As discussed above, the electrical connector includes the opening 128 which is configured to receive the exposed conductive core 162 of the wire 160. The exposed conductive core 162 of the wire 160 may thus be inserted through the opening 128 of the electrical connector 110. In turn, the exposed conductive core 162 is inserted between the contact tines 134 and through the opening 158 in the PCB 150 such that the exposed conductive core 162 may be seated between the contact tines 134 of the electrical connector 110. In this way, upon fully seating the wire 160 within the electrical connector 110, the wire 160 will extend through the opening 158 in the PCB 150.

Figure 12:
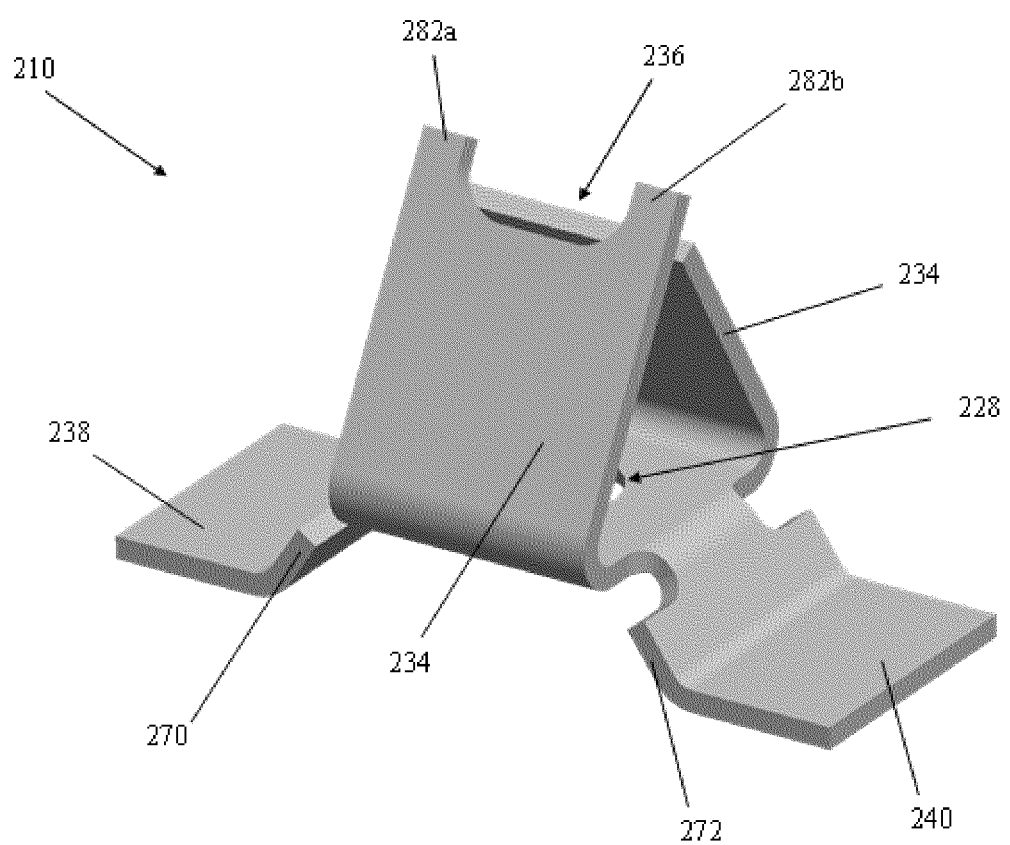
FIG. 12 depicts an electrical connector in accordance with an illustrative embodiment.

FIG. 12 depicts an electrical connector 210 in accordance with an illustrative embodiment. In an embodiment, the electrical connector 210 is a "single element" connector in that it is formed from a single conductive element as discussed in additional detail above. The single conductive element may be any suitable conductive metal material having a gauge and other physical characteristics suitable for maintaining the shape of the electrical connector 210 in the mounting process, as well as in the operating environment of the electrical component to which the electrical connector 210 is mounted.

The electrical connector 210 includes contact surfaces 238 and 240 that may be defined by any member or section of the single conductive material. The contact surfaces 238 and 240 are configured to electrically couple to respective contact elements on an electrical component such as a PCB or other electrical device. In an embodiment, the electrical connector 210 may be surface mounted directly onto the contact pad of the PCB or other electrical device. The contact surfaces 238 and 240 are connected to a main body portion of the electrical connector 210 by raised portions 270 and 272, respectively. Raised portions 270 and 272 extend away from contact surfaces 238 and 240, respectively, at an angle such that a main body portion of the electrical connector 210 which includes an opening 228 is located at a different height from a mounting surface relative to the contact surfaces 238 and 240. Such embodiments allow the electrical connector 210 to be mounted to either side of a PCB. For example, the electrical connector 210 may be top mounted or rear mounted, thereby providing the option of connecting a wire from either side of the PCB and not restricting on which side of the PCB additional circuitry may be located.

The opening 228 is configured to receive a wire or other electrically-conductive component inserted into the electrical connector 210. The electrical connector 210 includes a pair of contact tines 234 that extend from a surface in which the opening 228 is formed in a direction away from contact surfaces 238 and 240. In various alternative embodiments, electrical connector 210 may include one or more additional tines 234. The contact tines 234 may be formed from sections or cutouts of the single conductive element. The contact tines 234 are biased towards a central longitudinal axis of the electrical connector 210 downstream of the opening 228 in the insertion direction of a wire or other electrically-conductive component into the electrical connector 210. For example, the contact tines 234 may be formed from portions of the single conductive element that are bent or angled towards the central longitudinal axis to form a pinch point 236. The contact tines 234 are configured to contact an exposed core or portion of a wire or other electrically-conductive component inserted into the electrical connector 210. The contact tines 234 may be configured to separate and engage against the core of the wire or other electrically-conductive component as the wire or other electrically-conductive component is inserted between the contact tines 234. In this way, the pinch point 236 may also serve as a clamp point to prevent inadvertent removal of the wire or other electrically-conductive component from the electrical connector 210. In various embodiments, it may be desirable to include one or more release tabs defined on each of the contact tines 234 to provide a location for insertion of a tool between the contact tines 234 in order to open the contact tines 234 for selective removal of the wire or other electrically-conductive component.

In addition, one or more of contact tines 234 may include one or more release tabs 282a, 282b. In an embodiment, release tabs 282a, 282b are defined on one or more of the contact tines 234 generally forward of the pinch point 236. For example, the release tabs 282a, 282b may include extensions of a main body of the contact tines 234. The release tabs 282a, 282b provide a location for insertion of a tool between the contact tines 234 in order to open the contact tines 234 for removal of a wire if desired. The release tabs 282a, 282b may be variously configured. In the illustrated embodiment, the release tabs 282a, 282b include generally forwardly extending tabs that are substantially parallel to a center longitudinal axis that extends through the opening 228.

Figure 13:
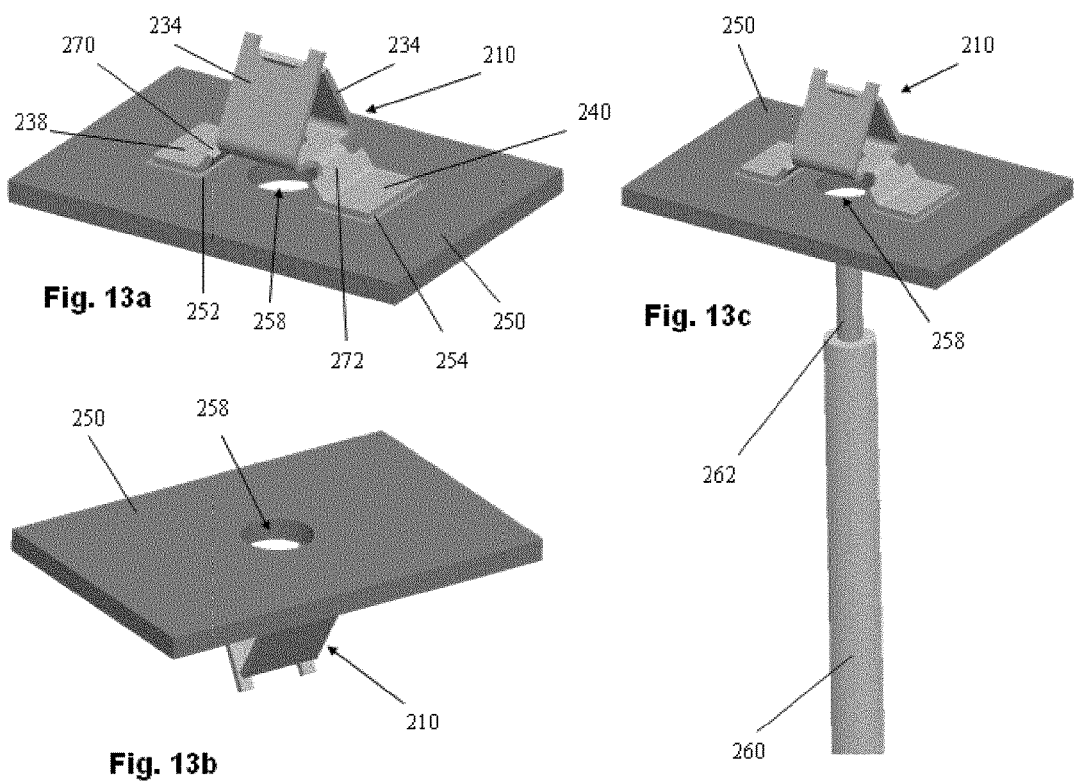
FIGS. 13a-13c depict a top mounting configuration for an electrical connector in accordance with an illustrative embodiment.

FIG. 13a depicts a bottom view of a top mounting configuration for the electrical connector 210 in accordance with an illustrative embodiment. In an embodiment, the electrical connector 210 is mounted to a surface of a PCB 250. The electrical connector 210 includes the contact surfaces 238 and 240 which are electrically coupled to contacts pads 252 and 254, respectively, of the PCB 250. The raised portions 270 and 272 extend away from the contact surfaces 238 and 240, respectively, at an angle such that portion of the electrical connector 210 in which the opening 228 is formed is located at an increased distance from a surface of the PCB 250.

FIG. 13b depicts a top view of the top mounting configuration for the electrical connector 210 in accordance with an illustrative embodiment. As mentioned above, the electrical connector 210 is mounted to a surface of the PCB 250. The PCB 250 includes an opening 258 that is configured to receive a wire or other electrically-conductive component to be inserted into the electrical connector 210. FIG. 13c depicts another bottom view of the top mounting configuration for the electrical connector 210 in accordance with an illustrative embodiment. A wire 260 includes an exposed conductive core 262. As discussed above, the PCB 250 includes the opening 258 which is configured to receive the exposed conductive core 262. The exposed conductive core 262 of the wire 260 may thus be inserted through the opening 258 of the PCB 250 into the electrical connector 210 such that the exposed conductive core 262 may be seated between the contact tines 234 of the electrical connector 210.

Figure 14:
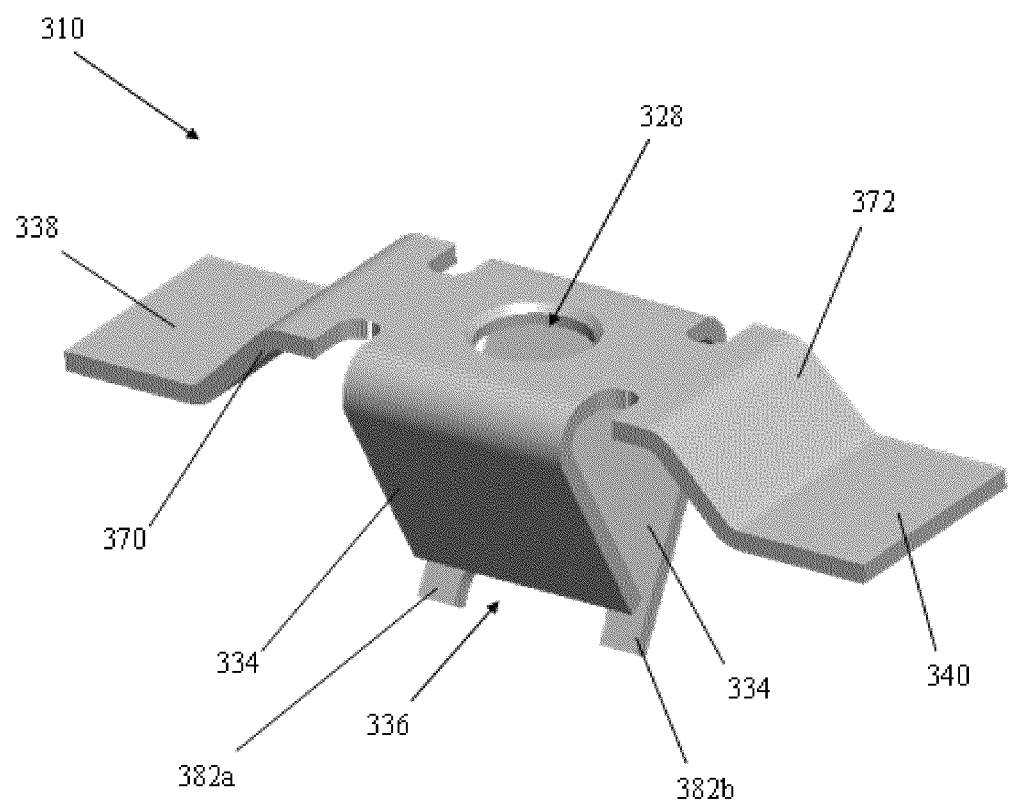
FIG. 14 depicts an electrical connector in accordance with another illustrative embodiment.

FIG. 14 depicts an electrical connector 310 in accordance with an illustrative embodiment. In an embodiment, the electrical connector 310 is a "single element" connector in that it is formed from a single conductive element as discussed in additional detail above. The electrical connector 310 includes contact surfaces 338 and 340 that may be defined by any member or section of the single conductive material. The contact surfaces 338 and 340 are configured to electrically couple to respective contact elements on an electrical component such as a PCB or other electrical device. In an embodiment, the electrical connector 310 may be surface mounted directly onto the contact pad of the PCB or other electrical device. The contact surfaces 338 and 340 are connected to a main body portion of the electrical connector 310 by raised portions 370 and 372, respectively. Raised portions 370 and 372 extend away from contact surfaces 338 and 340, respectively, at an angle such that a main body portion of the electrical connector 310 which includes an opening 328 is located at a different height from a mounting surface relative to the contact surfaces 338 and 340. Once again, such embodiments allow the electrical connector 310 to be mounted to either side of a PCB. For example, the electrical connector 310 may be top mounted or rear mounted, thereby providing the option of connecting a wire from either side of the PCB and not restricting on which side of the PCB additional circuitry may be located.

The opening 328 is configured to receive a wire or other electrically-conductive component inserted into the electrical connector 310. The electrical connector 310 includes a pair of contact tines 334 that extend from the surface in which the opening 328 is formed in a direction back toward the contact surfaces 338 and 340. In various alternative embodiments, electrical connector 310 may include one or more additional tines 334. The contact tines 334 may be formed from sections or cutouts of the single conductive element. The contact tines 334 are biased towards a central longitudinal axis of the electrical connector 310 downstream of the opening 328 in the insertion direction of a wire or other electrically-conductive component into the electrical connector 310. For example, the contact tines 334 may be formed from portions of the single conductive element that are bent or angled towards the central longitudinal axis to form a pinch point 336. The contact tines 334 are configured to contact an exposed core or portion of a wire or other electrically-conductive component inserted into the electrical connector 310. The contact tines 334 may be configured to separate and engage against the core of the wire or other electrically-conductive component as the wire or other electrically-conductive component is inserted between the contact tines 334. In this way, the pinch point 336 may also serve as a clamp point to prevent inadvertent removal of the wire or other electrically-conductive component from the electrical connector 310. In various embodiments, it may be desirable to include one or more release tabs defined on each of the contact tines 334 to provide a location for insertion of a tool between the contact tines 334 in order to open the contact tines 334 for selective removal of the wire or other electrically-conductive component.

In addition, one or more of contact tines 334 may include one or more release tabs 382a, 382b. In an embodiment, release tabs 382a, 382b are defined on one or more of the contact tines 334 generally forward of the pinch point 336. For example, the release tabs 382a, 382b may include extensions of a main body of the contact tines 334. The release tabs 382a, 382b provide a location for insertion of a tool between the contact tines 334 in order to open the contact tines 334 for removal of a wire if desired. The release tabs 382a, 382b may be variously configured. In the illustrated embodiment, the release tabs 382a, 382b include generally forwardly extending tabs that are substantially parallel to a center longitudinal axis that extends through the opening 328.

Figures 15A, 15B, 15C:
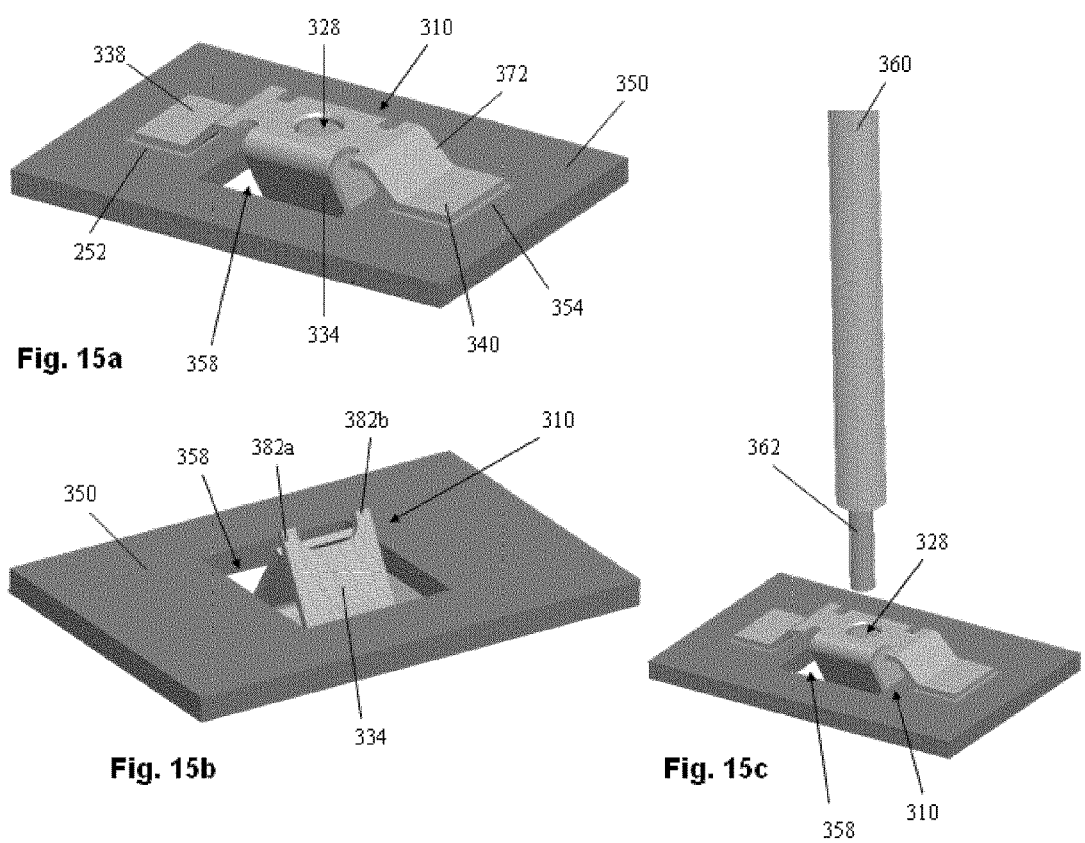
FIGS. 15a-15c depict a thru-board mounting configuration for an electrical connector in accordance with an illustrative embodiment.

FIG. 15a depicts a top view of a thru-board mounting configuration for the electrical connector 310 in accordance with an illustrative embodiment. In an embodiment, the electrical connector 310 is secured to a first surface of the PCB 350 and extends through the opening 358 in the PCB 350. The electrical connector 310 includes the contact surfaces 338 and 340 which are electrically coupled to the contacts pads 352 and 354, respectively, on the first surface of the PCB 350. The contact tines 334 of the electrical connector 310 extend thru the opening 358 in the PCB 350 such that the contact tines 334 extend a distance above a second surface of the PCB 350 that is opposite the first surface.

FIG. 15b depicts a bottom view of the thru-board mounting configuration for the electrical connector 310 in accordance with an illustrative embodiment. As mentioned above, the electrical connector 310 is mounted to a first surface of the PCB 350. The PCB 350 includes the opening 358 through which the contact tines 334 extend. FIG. 15c depicts another top view of the thru-board mounting configuration for the electrical connector 310 in accordance with an illustrative embodiment. The wire 360 includes the exposed conductive core 362. As discussed above, the electrical connector includes the opening 328 which is configured to receive the exposed conductive core 362 of the wire 360. The exposed conductive core 362 of the wire 360 may thus be inserted through the opening 328 of the electrical connector 310. In turn, the exposed conductive core 362 is inserted between the contact tines 334 and through the opening 358 in the PCB 350 such that the exposed conductive core 362 may be seated between the contact tines 334 of the electrical connector 310. In this way, upon fully seating the wire 360 within the electrical connector 310, the wire 360 will extend through the opening 358 in the PCB 350.

It should be readily appreciated by those skilled in the art that various modifications and variations can be made to the embodiments of the invention illustrated and described herein without departing from the scope and spirit of the invention. It is intended that such modifications and variations be encompassed by the appended claims.

What is claimed is:

1. An electrical connector comprising:
    a conductive contact element comprising a plurality of contact surfaces, wherein the conductive contact element comprises:
        an insert end comprising an inlet opening;
        a contact end opposite the insert end; and
        a first contact tine and a second contact tine each biased toward a centerline axis of the conductive contact element downstream of the wire insert end in an insertion direction into the conductive contact element, wherein the first and second contact tines define a contact pinch point, wherein at least one of the first or second contact tines comprises a first release tab and a second release tab configured to enable selective separation of the two or more contact tines.

2. The single element electrical connector of claim 1, wherein the conductive contact element connector consists of a single piece of electrically-conductive material.

3. The single element electrical connector of claim 1, wherein the first and second release tabs comprise extensions from a main body portion of the at least one of the first or second contact tines.

4. The single element electrical connector of claim 1, wherein the first and second release tabs extend in a direction of the centerline axis.

5. The single element electrical connector of claim 1, wherein the single element electrical connector does not include an insulator.

6. The single element electrical connector of claim 1, wherein the first release tab is located on a first side of the at least one of the first or second contact tines, wherein the second release tab is located on a second side of the at least one of the first or second contact tines, and wherein the first side is opposite the second side.

7. The single element electrical connector of claim 1, wherein the first and second contact tines extend from a base portion at the insert end in which the inlet opening is formed.

8. The single element electrical connector of claim 7, wherein the at least one of the first or second contact tines comprises a bent-over extension of the base portion.

9. The single element electrical connector of claim 7, wherein the first and second contact tines are angled towards the centerline axis to define a space that guides an inserted wire to the contact pinch point.

10. The single element electrical connector of claim 7, wherein at least one contact surface of the plurality of contact surfaces comprises contact feet extending generally transversely from the base portion such that, upon mounting of the electrical connector to a component, the centerline axis is generally perpendicular to the component.

11. The single element electrical connector of claim 7, wherein the base portion comprises at least one contact surface of the plurality of contact surfaces.

12. The single element electrical connector of claim 7, wherein the conductive contact element comprises a raised portion between at least one contact surface of the plurality of contact surfaces and the base portion such that, upon mounting of the conductive contact element to a mounting surface, the base portion is positioned at a greater distance from the mounting surface than the plurality of contact surfaces is positioned from the mounting surface.

13. The single element electrical connector of claim 12, wherein the first and second contact tines extend from the base portion in a direction away from the plurality of contact surfaces.

14. The single element electrical connector of claim 12, wherein the first and second contact tines extend from the base portion in a direction back toward the plurality of contact surfaces.

15. The electrical connector of claim 1, wherein the first and second release tabs extend from a forward-most portion of the at least one of the first or second contact tines.

16. The electrical connector of claim 15, wherein the first release tab is spaced apart from the second release tab on the at least one of the first or second contact tines such that a gap is formed between the first release tab and the second release tab.

17. An electrical device comprising:
  a conductive contact element comprising a plurality of contact surfaces, wherein the conductive contact element comprises:
    an insert end comprising an inlet opening;
    a contact end opposite the insert end; and
    a first contact tine and a second contact tine each biased toward a centerline axis of the conductive contact element downstream of the wire insert end in an insertion direction into the conductive contact element, wherein the first and second contact tines define a contact pinch point, wherein at least one of the first or second contact tines comprises a first release tab and a second release tab configured to enable selective separation of the two or more contact tines; and
  a printed circuit board comprising one or more contact pads, wherein the one or more contact pads are electrically connected to the plurality of contact surfaces.

18. The electrical device of claim 17, wherein the printed circuit board comprises an opening that corresponds to the inlet opening of the conductive contact element such that the centerline axis of the conductive contact element runs through the opening of the printed circuit board, and wherein the first and second contact tines extend through the opening in the printed circuit board.

19. The electrical device of claim 17, further comprising a wire extending through the opening in the printed circuit board and through the inlet opening of the conductive contact element, wherein the wire is electrically connected to the conductive contact element via the first and second contact tines.

20. The electrical device of claim 17, wherein the first and second release tabs extend from a forward-most portion of the at least one of the first or second contact tines, and wherein the first release tab is spaced apart from the second release tab on the at least one of the first or second contact tines such that a gap is formed between the first release tab and the second release tab.

* * * * *